(12) United States Patent
Milani et al.

(10) Patent No.: US 10,468,425 B2
(45) Date of Patent: Nov. 5, 2019

(54) EMBEDDED NON-VOLATILE MEMORY WITH SINGLE POLYSILICON LAYER MEMORY CELLS ERASABLE THROUGH BAND TO BAND TUNNELING INDUCED HOT ELECTRON AND PROGRAMMABLE THROUGH FOWLER-NORDHEIM TUNNELING

(71) Applicant: STMICROELECTRONICS S.r.l., Agrate Brianza (IT)

(72) Inventors: Luca Milani, Mairano (IT); Fabrizio Torricelli, Brescia (IT); Anna Richelli, Brescia (IT); Luigi Colalongo, Bertinoro (IT); Zsolt Miklos Kovàcs-Vajna, Brescia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 209 days.

(21) Appl. No.: 14/605,303

(22) Filed: Jan. 26, 2015

(65) Prior Publication Data
US 2015/0221661 A1 Aug. 6, 2015

(30) Foreign Application Priority Data
Feb. 4, 2014 (IT) .............................. MI2014A0154

(51) Int. Cl.
*H01L 27/115* (2006.01)
*H01L 27/11521* (2017.01)
(Continued)

(52) U.S. Cl.
CPC .... *H01L 27/11521* (2013.01); *H01L 27/1156* (2013.01); *H01L 27/11519* (2013.01);
(Continued)

(58) Field of Classification Search
None
See application file for complete search history.

(56) References Cited

U.S. PATENT DOCUMENTS

| | | |
|---|---|---|
| 5,761,126 A | 6/1998 | Chi et al. |
| 5,940,324 A | 8/1999 | Chi et al. |
| | (Continued) | |

OTHER PUBLICATIONS

Ching-Fang Lin et al., "A single-poly EEPROM cell structure compatible to standard CMOS process" Solid-State Electronics, vol. 51, pp. 888-893, 2007.
(Continued)

*Primary Examiner* — Nilufa Rahim
(74) *Attorney, Agent, or Firm* — Seed Intellectual Property Law Group LLP

(57) ABSTRACT

A non-volatile memory includes cells arranged in rows and columns. Each memory cell includes an access portion and a control portion. The access and control portions share an electrically floating layer of conductive material defining a first capacitive coupling with the access portion and a second capacitive coupling with the control portion. The first capacitive coupling defines a first capacity lower than a second capacity defined by the second capacitive coupling. The control portion is configured so that an electric current extracts charge carriers from the electrically floating layer through Fowler-Nordheim tunneling to store a first logic value in the memory cell. The access portion is configured so that an electric current injects charge carriers in the electrically floating layer by injection of band-to-band tunneling-induced hot electrons to store a second logic value, respectively, in the memory cell.

19 Claims, 10 Drawing Sheets

(51) Int. Cl.
*H01L 27/11519* (2017.01)
*H01L 27/1156* (2017.01)
*H01L 29/66* (2006.01)
*H01L 29/788* (2006.01)
*H01L 27/11558* (2017.01)

(52) U.S. Cl.
CPC .. *H01L 27/11558* (2013.01); *H01L 29/66825* (2013.01); *H01L 29/7881* (2013.01)

(56) References Cited

U.S. PATENT DOCUMENTS

| | | | |
|---|---|---|---|
| 8,693,256 | B2 | 4/2014 | Pasotti et al. |
| 2004/0119113 | A1* | 6/2004 | Simacek ............... H01L 27/115 257/318 |
| 2009/0080257 | A1* | 3/2009 | Oka ........................ G11C 5/025 365/185.13 |
| 2009/0201742 | A1* | 8/2009 | Lee .................... G11C 16/0441 365/185.24 |
| 2009/0267127 | A1* | 10/2009 | Chen ...................... G11C 16/10 257/314 |
| 2010/0157669 | A1 | 6/2010 | Audzeyeu et al. |
| 2011/0157972 | A1 | 6/2011 | Pasotti et al. |
| 2011/0157977 | A1 | 6/2011 | Pasotti et al. |
| 2011/0316067 | A1 | 12/2011 | Yao et al. |
| 2012/0037971 | A1 | 2/2012 | Kwon et al. |
| 2013/0343128 | A1 | 12/2013 | Torricelli et al. |

OTHER PUBLICATIONS

Chen et al., "A New Antifuse Cell With Programmable Contact for Advance CMOS Logic Circuits," *IEEE Electron Device Letters* 29(5): 522-524, 2008.

Chi et al., "A New Single-poly Flash Memory Cell with Low-voltage and Low-power Operations for Embedded Applications," *Device Research Conference Digest IEEE*, 1997, pp. 126-127.

Dray et al., "A Novel Memory Array Based on an Annular Single-Poly EPROM Cell for Use in Standard CMOS Technology," *IEEE Int. Workshop on Memory Technology, Design and Testing (MTDT)*, 2002, pp. 143-148.

Hoefler et al., "Analysis of a Novel Electrically Programmable Active Fuse for Advanced CMOS SOI One-Time Programmable Memory Applications," *Solid State Device Research Conference*, IEEE. 2006, pp. 230-233.

Lee et al., "A New Differential P-Channel Logic-Compatible Multiple-Time Programmable (MTP) Memory Cell With Self-Recovery Operation," *IEEE Electron Device Letters* 32(5): 587-589, 2011.

Ma et al., "Reliability of pFET EEPROM With 70-Å Tunnel Oxide Manufactured in Generic Logic CMOS Processes," *IEEE Transactions on Device and Materials Reliability* 4(3): 353-358, 2004.

Na et al., "High-Performance Single Polysilicon EEPROM With Stacked MIM Capacitor," *IEEE Electron Device Letters* 27(4): 294-296, 2006.

Na et al., "A Novel Single Polysilicon EEPROM Cell With a Polyfinger Capacitor," *IEEE Electron Device Letters,* 28(11): 1047-1049, 2007.

Na et al., "Novel Single Polysilicon EEPROM Cell With Dual Work Function Floating Gate," *IEEE Electron Device Letters* 28(2): 151-153, 2007.

Ohnakado et al., "Device Characteristics of 0.35 μm P-Channel DINOR Flash Memory Using Band-to-Band Tunneling-Induced Hot Electron (BBHE) Programming," *IEEE Transactions on Electron Devices* 46(9): 1866-1871, 1999.

Ohsaki et al., "A Single Poly EEPROM Cell Structure for Use in Standard CMOS Processes," *IEEE Journal of Solid-State Circuits* 29(3): 311-316, 1994.

Raszka et al., "Embedded Flash Memory for Security Applications in a 0.13μm CMOS Logic Process," *IEEE International Solid-State Circuits Conference*, 2004, 10 pages.

Rosenberg, "Embedded Flash on a CMOS Logic Process Enables Secure Hardware Encryption for Deep Submicron Designs," *Non-Volatile Memory Technology Symposium IEEE*, 2005, 3 pages.

Shi et al., "Zero-Mask Contact Fuse for One-Time-Programmable Memory in Standard CMOS Processes," *IEEE Electron Device Letters* 32(7): 955-957, 2011.

Shukuri et al., "A 10k-Cycling Reliable 90nm Logic NVM "eCFlash"(embedded CMOS Flash) Technology," 3rd *International Memory Workshop (IMW) IEEE*, 2011, 2 pages.

Torricelli et al., "Half-MOS Single-Poly EEPROM Cell in Standard CMOS Process," *IEEE Transactions on Electron Devices* 60(6): 1892-1897, 2013.

Wang et al., "Highly Reliable 90-nm Logic Multitime Programmable NVM Cells Using Novel Work-Function-Engineered Tunneling Devices," *IEEE Transactions on Electron Devices* 54(9): 2526-2530, 2007.

Wu et al., "A High-Density MTP Cell With Contact Coupling Gates by Pure CMOS Logic Press,". *IEEE Electron Device Letters* 32(10): 1352-1354, 2011.

* cited by examiner

EMBEDDED NON-VOLATILE MEMORY WITH SINGLE POLYSILICON LAYER MEMORY CELLS ERASABLE THROUGH BAND TO BAND TUNNELING INDUCED HOT ELECTRON AND PROGRAMMABLE THROUGH FOWLER-NORDHEIM TUNNELING

TECHNICAL FIELD

The approach according to one or more embodiments of the present invention relates to the field of electronics. More specifically, this approach relates to non-volatile memory devices.

BACKGROUND

Non-volatile memory devices are used in any application where storage of information has to be maintained even when the memory devices are not powered. In recent years, the market for embedded non-volatile memories (emNVM) has undergone a considerable development. The emNVM are implemented with other devices on a single chip to obtain (electronic) Systems-on-Chip (SoC). The emNVM are implemented in the SoC, for example, to allow post-manufacturing calibration/adjustment (e.g., for analog and/or radio-frequency circuits) by the manufacturer and/or post-manufacturing customization/configuration by the final user. Moreover, the NVM are implemented in SoC where it is desirable to store a limited amount of data in systems such radio frequency identification (RFID) systems.

Several technologic approaches are available to provide an emNVM. Some approaches allow a single programming (or One Time Programmable) of the emNVM, such as poly-fuse or anti-fuse type emNVM.

Other technologic approaches allow performing more write cycles on the emNVM, such as in the case of EEPROM (Electrical Erasable and Programmable Read-Only Memory) or FLASH emNVM, which store a given datum by trapping electric charges in an insulated terminal, or floating gate, of a storage transistor.

However, these types of memory cells use technologies and processes that are not included in standard complementary metal oxide semiconductor (CMOS) technology (to providing the floating gate transistors) usually used to implement SoC. In fact, the storage transistors use an additional polysilicon layer to define their floating gates regions (in addition to that used to define their control gate regions as in the standard CMOS). This difference adds design complexity, which significantly increases the manufacturing cost of the memory devices.

In the art, memory cells of the floating gate type obtainable using standard CMOS processes have been developed. For example, single-poly EEPROMs (or single polysilicon EEPROM) were developed, which may be implemented in standard CMOS technology since they require only one level of polysilicon.

In these memory cells, the floating gate is made from a single polysilicon layer shared between a control capacitor, which dominates and controls the potential of the gate terminal of a MOS transistor connected thereto by capacitive coupling. The program and erase of the cell may occur by hot carrier injection (HCI), such as channel hot electron (CHE), or by Fowler-Nordheim (FN) tunneling in the floating gate in the proximity of the drain region of the transistor floating gate. Italian patent application No. MI2009A002349, of the same Applicant, describes an emNVM that implements single-poly type memory cells.

In addition to the most common injection mechanisms of FN tunneling and CHE, also the injection mechanism called band-to-band tunneling-induced hot electron (BBHE) has been used for the program operation in single-poly EEPROM. U.S. Pat. Nos. 5,940,324 and 5,761,126 describe examples of memory cells programmed by BBHE generated in correspondence of the drain region of a MOS transistor of the memory cell.

Such memory cells use rather complex (and of considerable size on the chip) control circuitry (e.g., row and column decoders, reading and writing unit, etc.) because they must be able to generate and provide to each cell in a matrix of the emNVM a plurality of different voltages, also of high value (compared with a supply voltage of the SoC in which the emNVM is integrated).

SUMMARY

In general terms, the approach according to one or more embodiments provides an emNVM that includes a matrix of memory cells that is compact and simply addressable with reduced voltage values in such a way to simplify a control structure to operate on the matrix of memory cells compared with known emNVMs. Particularly, one or more aspects of the approach according to specific embodiments are indicated in the independent claims, with advantageous features of the approach that are indicated in the dependent claims.

More specifically, one aspect of the approach according to an embodiment provides a non-volatile memory integrated in a chip of semiconductor material. The non-volatile memory includes a plurality of memory cells arranged in a plurality of rows and columns. Each memory cell comprises an access portion and a control portion. The access portion and the control portion share an electrically floating layer of conductive material which provides a first capacitive coupling with the access portion and a second capacitive coupling with the control portion, the first capacitive coupling defining a first capacity lower than a second capacity defined by the second capacitive coupling. The access portion of each memory cell is formed in the chip in a first well of semiconductor material having a doping of a first type. The control portion is formed in the chip in a second well of semiconductor material having a doping of a second type. The access portion is configured to be traversed by an electric current, or have an electric current flow therethrough indicative of a logic value stored in the memory cell during a read operation of the memory cell. In the approach according to an embodiment, the control portion is configured so that an electric current adapted to extract charge carriers from the electrically floating layer through Fowler-Nordheim tunneling flows therethrough to impose the storing of a first logic value in the memory cell and the access portion is further configured to be traversed by an electric current adapted to inject charge carriers in the electrically floating layer by injection of band-to-band tunneling-induced hot electrons impose the storing of a second logic value, respectively, in the memory cell.

BRIEF DESCRIPTION OF THE DRAWINGS

FIG. 2B is a schematic cross-section view of the memory cell of FIG. 2a.

DETAILED DESCRIPTION

An approach according to one or more embodiments, as well as additional features and its advantages, will be best understood by reference to the following detailed description, given purely by way of non-limiting example, to be read in conjunction with the accompanying figures (in which corresponding elements are indicated with the same or similar references and their explanation is not repeated for brevity). In this respect, it is expressly understood that the figures are not necessarily to scale (with some details that may be exaggerated and/or simplified) and that, unless otherwise indicated, they are simply used to conceptually illustrate the structures and procedures described.

Figure 1:
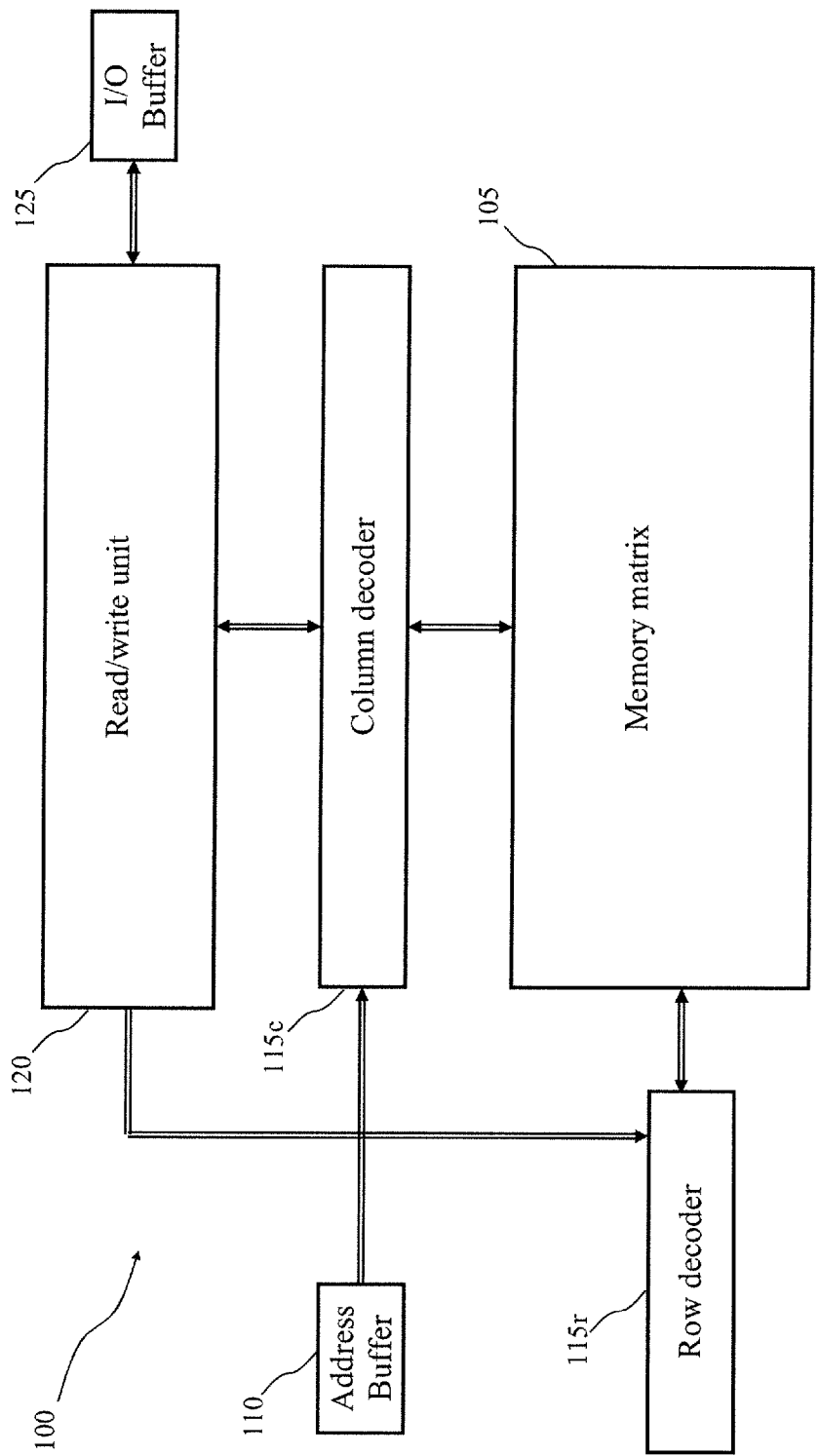
FIG. 1 is a block diagram of an emNVM in which the approach according to the present invention may be implemented.

With reference to the figures, FIG. 1 is a block diagram of an emNVM in which an approach according to the present invention may be implemented. The memory device 100 is non-volatile integrated, or emNVM (embedded Non-Volatile Memory). The memory device 100 comprises a matrix 105, which is formed by a plurality of memory cells (not shown in the figure) that are organized in rows and columns (for example, 128-512 rows and 512-1024 columns). Each memory cell stores a logic value (e.g., corresponding to a bit of information). For this purpose, the memory cell is based on a floating-gate MOS transistor. This transistor has a threshold voltage which depends on an electrical charge in its floating gate. The different levels of the threshold voltage represent corresponding logic values. Conventionally, the memory cell is programmed (to a logic value 0) when it has a high threshold voltage, while the memory cell is erased (to a logic value 1) when it has a low threshold voltage.

In one embodiment, as described in detail below, the memory device 100 may individually erase each memory cell. The programming is performed simultaneously for a set of memory cells (for example, a word or a sector). The reading of the cells of the matrix 105 may be performed for single cell.

An address buffer 110 receives an address of a memory cell or a set of memory cells (for example, to a corresponding word) in the matrix 105. In particular, a portion of the address is supplied to a row decoder 115r, which selects the selected row in the matrix 105. The other portion of the address is instead supplied to a column decoder 115c, which selects a column in the matrix 105 among the columns of the matrix 105. In this way, it is possible to (electrically) access to each memory cell of the matrix 105.

A read/write unit 120 controls the operation of the row decoder 115r and of the column decoder 115c. The read/write unit 120 furthermore comprises all the components (such as power management unit with charge pumps, sense amplifiers, comparators, reference cells, pulse generators, and the like) that are used to write (i.e., program, or erase) the memory cells and read their logic values. The read/write unit 120 is also coupled with an input/output (I/O) buffer 125, the input/output buffer 125 receives data (one or more bits) to be written in the matrix 105, or provides the data read from the matrix 105.

Figure 2A:
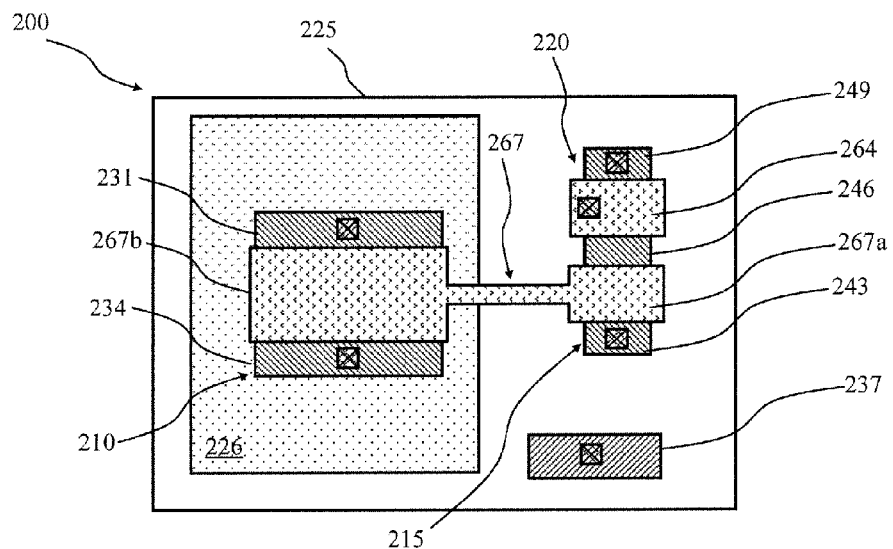
FIG. 2A is a schematic plan view of a memory cell according to one embodiment of the present invention.
Figure 2B:
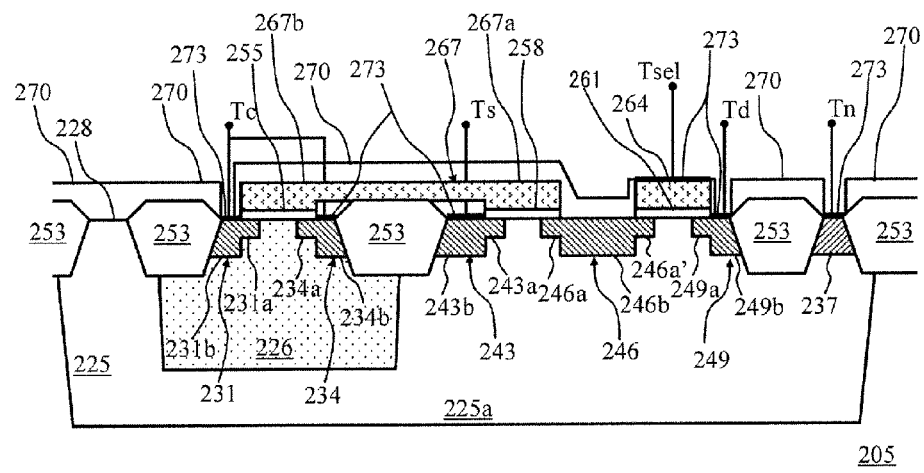

Turning now to FIGS. 2A and 2B, schematic plan and cross-section views, respectively, of a memory cell 200 according to one embodiment are illustrated. The memory cell 200 is integrated within a portion of substrate 205 of a chip of semiconductor material (e.g., silicon Si). The portion of the substrate may have a doping of p-type (as in the case of silicon doped with boron B).

The memory cell 200 comprises a control portion which in turn comprises a capacitive element 210, and a portion of access which in turn comprises a memory transistor 215 and a selection transistor 220 (e.g., of the type Metal-Oxide-Semiconductor or MOS). An n well 225 with an n-type doping (as in the case of silicon doped with phosphorus P) extends from a surface of the chip 228 in the substrate 205 (down to a first depth). Advantageously, the n well 225 comprises a deep region 225a to n-type doping with a concentration greater than the doping of the n well 225—n+ doping as indicated in the following. This deep region 225a defines a (lower) boundary with the substrate 205.

A p well 226 is formed inside the n well 225. The p well 226 extends from the surface of the chip 228 towards the inside of the n well 225 (down to a second depth lower than the first depth).

Inside the p well 226 two plate regions 231 and 234 with a p-type doping corresponding to a first plate of the capacitive element 210 are formed. The plate regions 231 and 234 have a p-type doping with a concentration greater than the doping of the substrate 205—identified as p+ doping in the following.

Preferably, the plate regions 231 and 234 each comprise an extension portion 231a and 234a, which extend towards each other, in the proximity of the surface 228 and have a p-type doping—indicated as p* doping in the following—different from (e.g., lower than) the p+ doping of a main portion 231b and 234b of the plate regions 231 and 234, respectively.

Inside the n well 225 is also formed a n+ contact region 237, having an n+ type doping, in order to electrically contact the n well, and three distinct regions 243, 246 and 249 of p+ type. In the following, a first p+ region is indicated as a source region 243, as corresponds to the source region of the memory transistor 215, a second p+ region is indicated as the shared region 246, as corresponds to the drain region of the memory transistor 215 and to the source region of the selection transistor 220, while a third p+ region is indicated as drain region 249, as corresponds to the drain region of the selection transistor 220.

Preferably, the source 243 and shared 246 regions each comprise an extension portion 243a and 246a, which extend towards each other in the proximity of the surface 228, and have a p* type doping. In one embodiment, the drain region also comprises an extension portion 249a which extends from a main portion 249b toward an additional extension portion 246a' of the shared region 246.

A plurality of insulating decoupling elements 253 (e.g., a plurality of Shallow Trench Insulation—STI) are formed at the surface 228 so as to extend, with its main portion, towards the inside of the chip and, with a minor portion, above the surface 228 of the chip. Advantageously, the decoupling elements 253 are shaped to define, in plan view, the wells 225 and 226, thus delimiting and (electrically) insulating the latter between them and other surrounding elements possibly formed in the same chip.

A capacitor insulating layer 255 electrically insulating material (e.g., silicon oxide $SiO_2$) is formed on the surface 228 of the chip, in a space thereabove, and substantially delimited by, the plate regions 231 and 234 (with the extension portions 231a and 234a which extend in the n well 225 beneath the capacitor insulating layer 255).

Similarly, an cell insulating layer 258 of electrically insulating material is formed on the surface 228 of the chip, in a space thereabove, and substantially delimited by, the regions 243 and 246 (in such a way to form the oxide layer of the memory transistor 215 and with the extension portions 243a and 246a which extend in the p well 226 beneath the cell insulating layer 258).

A selector insulating layer 261 of electrically insulating material is formed on the surface 228 of the chip, in a space thereabove, and substantially delimited by, the regions 246 and 249 (in such a way to form the oxide layer of the selection transistor 220). A polysilicon gate layer 264 is formed over the insulating selection layer 261 (in such a way to form the gate region of the selection transistor 220).

A polysilicon coupling floating layer 267—hereinafter referred to as the floating layer 267 for sake of simplicity—is formed between the capacitor insulating layer 255 and the cell insulating layer 258. In this way, a capacitor portion 267a of the floating layer 267 form a second plate of the capacitive element 210 while a transistor portion 267a of the layer 267 form the floating gate region of the memory transistor 215.

One or more oxide layers 270 (e.g., a layer of silicon oxide and/or silicon nitride) are formed so as to cover (and electrically insulate) the floating layer 267, the gate layer 264 and the insulating layers 255, 258 and 261. The floating layer 267 is electrically insulated from what formed in the substrate 205 due to the oxide layers 270.

In correspondence of the regions 237, 231, 234, 243 and 249 respective salicide layers 273 of a metallic material (defined transition metal, such as cobalt) are formed to facilitate a subsequent electrical connection with metal elements for electrical connection subsequently formed by means of metallization higher levels. Preferably, the salicide layer 273 is formed only on a respective (contact) portion of the regions 237, 231, 234, 243 and 249; for example, in FIG. 2A such contact portions are indicated by a respective square.

The regions 237, 231, 234, 243, 249 and the gate layer 264 are connected to the upper metallization layers (shown schematically by a line in FIG. 2B) to form the corresponding capacitor Tc (connected to both regions of armor 231 and 234), the source Ts, drain Td, n well Tn and selection Tsel terminals in order to be electrically connected to external elements to the memory cell 200 (e.g., the row decoder 115r and the column decoder 115c shown in FIG. 1).

Because of the structure described above, the memory cell 200 (in particular because of the deep region 225a) does not electrically interact significantly with the substrate 205 of the chip in which it is integrated. Therefore, the memory cell 200 is substantially electrically insulated from any other memory cells 200 and/or other devices (not shown) formed in the substrate 205 (and therefore electromagnetic interference between the memory cells 200 formed in the substrate 205 are suppressed or at least substantially attenuated). In one embodiment, the floating layer 267 is formed in such a way to define a capacitive coupling factor α between a predetermined capacity Cc of the capacitive element 210 and a capacitance Ct of the memory transistor 215.

The floating layer 267 is formed with a transistor portion 267a having a size (area) lower than the size of a capacitive portion 267b. Preferably, the size of the portions 267a and 267b are designed so as to obtain a capacitive coupling factor α equal to:

$$\alpha = \frac{Cc}{Cc + Ct} \geq 0.5 \ (e.g., \alpha = 0.8). \tag{1}$$

In other words, the capacitive coupling factor α makes the floating layer 267 (corresponding to the floating region of a classic floating gate transistor) coupled, from the electrical point of view, predominantly to the regions of the capacitor 231 and 234 rather than to the source 243 and shared 246 regions.

Because of the structure described above and the resulting α capacitive coupling, it is possible to perform an erase operation (imposing the logic 1 value as stored data) of the memory cell 200 by band-to-band tunneling-induced hot electron (BBHE), the phenomenon stimulated at the insulating layer 255 (i.e., in correspondence of the capacitive element 210). A program operation (imposing the logic 0 value as data stored) of the memory cell 200 is performed by means of the of Fowler-Nordheim (FN) tunneling stimulated at the insulating layer 258 (i.e., in correspondence of the memory transistor 215).

After having described the structure of the memory cell 200, we turn now to describe an operation thereof according to one embodiment. The memory cell 200 may be controlled by applying appropriate voltages to the terminals Tc, Ts, Td, Tn and Tsel. According to the value of the applied voltages, the memory cell 200 may be controlled to store the logic 1 value, through the erase operation, to store the logic 0 value, through the program operation, or for detecting a previously stored value, through a read operation.

To ensure a control granularity equal to a bit in a matrix (such as the matrix 105 of FIG. 1) of memory cells 200 (i.e., to ensure a control of the data stored in a single memory cell 200 independently from other memory cells 200 that form the matrix 105) is provided the capability to inhibit at least one of the program or erase operations (so as to be able to restrict the program/erase operation to a single memory cell 200 selected).

Table 1 below is an example of biasing schemes applicable to terminals Tc, Ts, Td, Tn and Tsel of the memory cell 200 according to the selected operation among erase, program and read operations or the program operation inhibition.

TABLE 1

|  | Tc | Tn | Tsel | Ts | Td |
|---|---|---|---|---|---|
| Erase | GND | GND | GND | Ve | GND |
| Program | Vp | GND | GND | GND | GND |
| Read | Vr | Vdd | GND | Vsr | Vdr |
| Program inhibition | Vp | GND | GND | Vi | GND |

To perform the erase operation, the source terminal Ts is brought to an erase voltage Ve (for example, Ve<0, as Ve=−5V for a technology with a supply voltage Vdd between 3V and 5V), while the other terminals Tc, Td, and Tsel are all maintained at a reference voltage GND (for example, GND=0V). In an alternative embodiment (e.g., in which values are not available negative voltage), in order to promote the BBHE terminals Tc, Td, Tn and Tsel are brought to a erase voltage Ve positive (for example, Ve=+5 V) while the source terminal Ts is maintained at the reference voltage GND (obtaining a configuration substantially complementary to what is indicated in Table 1).

In this configuration, due to the capacitive coupling factor α, an electric potential of the floating layer 267 appears to be close to a potential of the capacitor terminal Tc (i.e., GND in the example considered). The electric potential of the transistor portion 267a floating layer 267 is substantially differ from the (preferably, is substantially greater than) erase voltage Ve that biases the terminal Ts. In this way, a fraction Ibbhe (generated for BBHE) of the electric current Icn flowing between terminals Tn and Ts is injected into the floating layer 267 through the insulating layer of the transistor 258 by means of BBHE (in other words, through the BBHE charge carriers are inject in the floating layer 267, thereby imposing the logic 1 value in the memory cell 200).

Advantageously, the injection efficiency of BBHE, in other words the ratio between the injected electric current fraction Ibbhe and the electric current generated Icn, appears to be generally better than the efficiency obtainable with CHE or similar phenomena usually used in known memory cells. In fact, the current intensity to stimulate the CHE appears to be substantially greater than the current intensity required to stimulate the BBHE.

In addition, the erase operation by BBHE uses an erase voltage value Ve substantially lower than the values needed to perform an erase by FN tunneling. In one embodiment, the voltage Ve is in the order of a value of the supply voltage Vdd (thus Ve may be generated without charge pumps, allowing a reduction of power consumption to manage the emNVM and a complexity in the provision of the electrical connections between the memory cell 200 and other elements of the emNVM 100, as described hereinbelow).

In one embodiment, the absolute value |Ve| of the erase voltage Ve is the order of a value of a supply voltage Vdd (therefore it is possible to reduce power consumption necessary to manage the erase operation). To execute the program operation, the capacitor terminal Tc is brought to a program voltage Vp (e.g., Vp<0, as Vp=−15V for a technology with a supply voltage Vdd between 3V and 5V), while the other terminals Ts, Td, and Tsel are all maintained at the reference voltage GND (for example, GND=0V).

Consequently, the potential drop on the transistor insulating layer 258 (substantially corresponding to Vp in the considered example) has an intensity adapted to activate a FN tunneling current, therethrough, of such intensity to extract electrons trapped in the floating layer 267 (thereby imposing the logic 0 value in the memory cell 200).

The plate regions 243 and 246, through the extension portions 243a and 246a, generate an electric field when biased through the capacitor terminal Tc to the program voltage Vp. This electric field extends in the n well region 225 beneath the capacitor insulating layer 258 (also referred to as channel region). The electric field has an intensity such as to determine an extraction of electrons stored in the floating layer 267 substantially uniform in the channel region (in a similar way to what happens in the floating gate transistors implemented in FLASH memories).

The read operation of the data stored is done by measuring a drain current Id of the memory transistor 215, after having enabled the selection transistor 220 (for example, by biasing the terminal Tsel to the value of the reference voltage), biasing the terminal Tc to a read voltage Vr, the terminal Td to a drain read voltage Vdr (e.g., Vdr=Vdd−1V) and the terminal Ts to a source read voltage Vsr (e.g., Vsr=Vdd). On the basis of the measured value of the current Id, it is possible to determine the value of the threshold voltage of the memory transistor 215, and then the logic value stored in the memory cell 200 (in other words, the current Id provides an indication of the logic value stored in the memory cell 200).

In one embodiment, the current Id may provide indication of the logic value stored in an indirect way. For example, the threshold voltage of the memory transistor 215 may be determined from the value of the voltage Vdr to be applied to the terminal Td to measure a known current Id (e.g., Id=10 μA).

As it may be known, the charge carriers injected into the floating layer 267 during the program operation move the threshold voltage of the memory transistor 215 to a program value $Vth_{prog}$ lower than a thermal equilibrium value (i.e., $Vth_{prog} > Vth_{eq}$). Otherwise, the charge carriers extracted from the floating layer 267 during the erase operation move the threshold voltage of the memory transistor 215 to a erase value $Vth_{erase}$ greater than the thermal equilibrium value (i.e., $Vth_{erase} < Vth_{eq}$). The greater the distance between the erase value $Vth_{erase}$ and program value $Vth_{prog}$, the greater is the duration for which a logic value remains stored in the memory cell 200.

The selection transistor 220 makes it possible to extract a quantity of charge carriers from the floating layer 267 to determine a program value $Vth_{prog}$ (virtually) negative for the memory transistor 215 without making the memory cell 200 unreadable (as would happen if the transistor selection of 220 was omitted). This allows a distance between the value and the value of cancellation $Vth_{erase}$ programming $Vth_{prog}$ to be obtained such as to ensure high reliability of the memory cell 200 (for example, ensuring a retention of a logic value stored in the order of about ten years).

The inhibition of the program operation takes place while maintaining a reduced voltage drop on the capacitor insulating layer 258 when the program voltage Vp is provided to the capacitor terminal Tc. This is achieved by imposing an inhibition voltage Vi of appropriate value to the source terminal Ts.

For example, to inhibit the memory cell 200, a voltage Vi is provided to the source terminal Ts having value greater than the program voltage Vp that is applied to the terminal Tn (e.g., Vp=−15V<Vi=−5V). The source region 243 (biased at the inhibition voltage Vi) forms with plate regions 231 and 234 (biased to the program voltage Vp) a pn junction (as in the case of a diode) in reverse biased. Between the ends of such junction a voltage value equal to Vp−Vi is developed sized in such a way that a remaining voltage developed on the capacitor insulating layer 258 is not strong enough to promote the FN tunneling. Based upon the configuration of the inhibition erase operation just described, it is possible to arrange a matrix 105 of memory cells 200 completely provided with a single polysilicon layer 267 (i.e., by processes comprised in a standard CMOS technology) and, preferably, in which sets of memory cells 200 share a common n well (as described hereinbelow).

In an alternative embodiment (not shown), a complementary memory cell is formed in which the types of doping described above are substantially reversed. In other words, inside a n-type well a capacitive element is formed with plate regions of p-type and a p-type well, in the latter memory and selection transistors are formed with shared source and drain regions of the n-type, and a well contact region of the p-type.

Figure 3A:
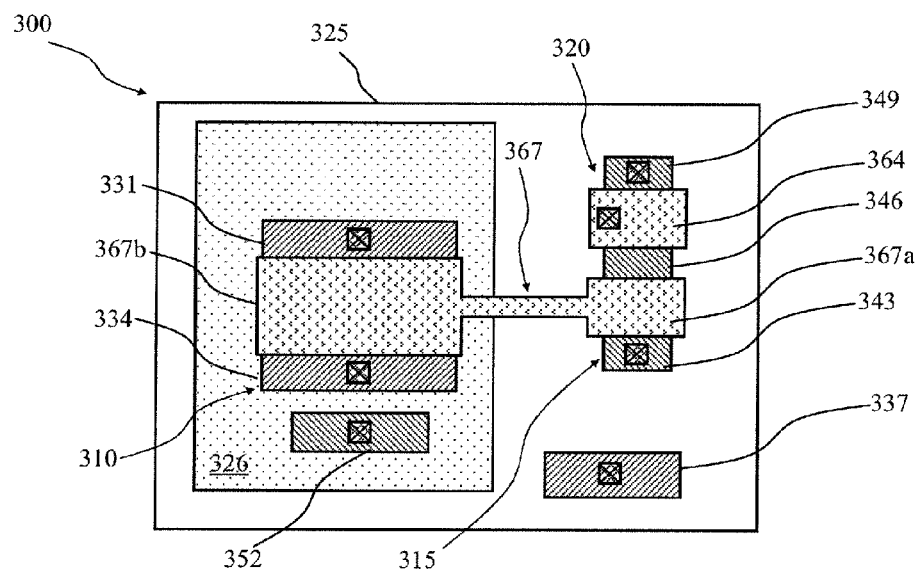
FIG. 3A is a schematic plan view of a memory cell according to a different embodiment of the present invention.
Figure 3B:
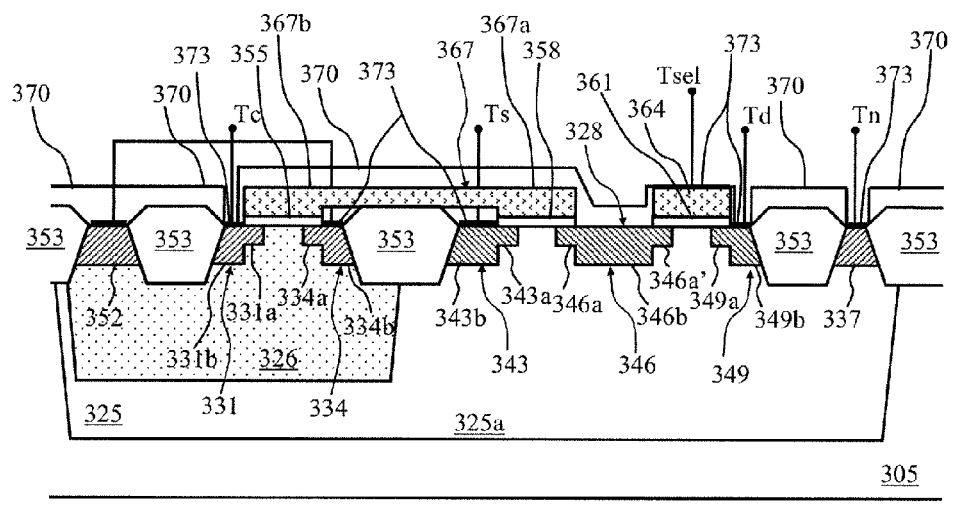
FIG. 3B is a schematic cross-section view of the memory cell of FIG. 3A.

Turning now to FIGS. 3A and 3B, schematic plan and cross-section views, respectively, of a memory cell 300 are illustrated according to an embodiment. The memory cell 300 differs from memory cell 200 as follows (it should be noted that elements of the memory cell 300 corresponding to elements of the memory cell 200 are indicated by similar references and their description is not repeated for sake of brevity).

Inside the p well 326 are formed two plate regions 331 and 334 with a n+ type doping (with extension portions 331a and 334a having an n* type doping having a different concentration than the n+ doping, for example, lower) that correspond to a first plate of the capacitive element 310. Also, the floating layer 367 is n+ doped, unlike the cell 200 in which it has a p+ doping.

In addition, inside the p well 326 formed a p+ contact region 337 having a p+ type doping is also formed. In this case, a salicide layer 373 is disposed on a surface portion of the p+ contact region 352 which is then electrically coupled to the control terminal Tc, together with the two plate regions 331 and 334.

Because of the structure just described, the FN tunneling program performance is improved (in particular, it is possible to design the memory cell 300 in such a way to perform a faster programming or at the same speed but with a program voltage Vp lower than the cell memory 200) thanks to the optimization of the performance of energy bands (e.g., the conduction and valence bands) of the capacitive element 310, in particular in correspondence of the capacitor insulating layer 258 (through which the FN tunneling occurs) thanks the n+ type doping of the floating layer 367.

Referring to FIGS. 4A-4J, some steps of a manufacturing process of a memory cell 200 schematically illustrated in these figures will now be described. Initially (FIG. 4A), the decoupling elements 253 at the surface 228, and then the n well 225 are formed. A layer of photosensitive material, or resist, is deposited on the surface 228 of the p substrate 205, a portion of the resist (corresponding to a plan view of the decoupling layer 253) is defined by means of a mask (not shown) and is impressed by an electromagnetic radiation (which passes through the mask). The impressed portion of the resist is selectively removed (for example, via a chemical etching) to leave exposed a portion of the surface 228 of the substrate 205 corresponding to the plan view of the decoupling elements 253 to be formed. An insulating layer disposed on the surface 228 is removed from the portion of the surface 228 defined by the mask. At this point, the decoupling elements 253 are formed, for example by an etching process, to define the trenches, which are filled with insulating material by chemical vapor deposition (CVD).

The n well 225 is formed in the p substrate 205. For example, the n well 225 may be formed as known by a photolithography process (in a similar way to that described above) followed by a respective chemical vapor deposition (CVD) or a process of ion implantation in a selected portion of the chip not covered by the decoupling layer 253. Preferably, the deep region 225a of the n well 225 is formed by ion implantation.

Figure 4A:
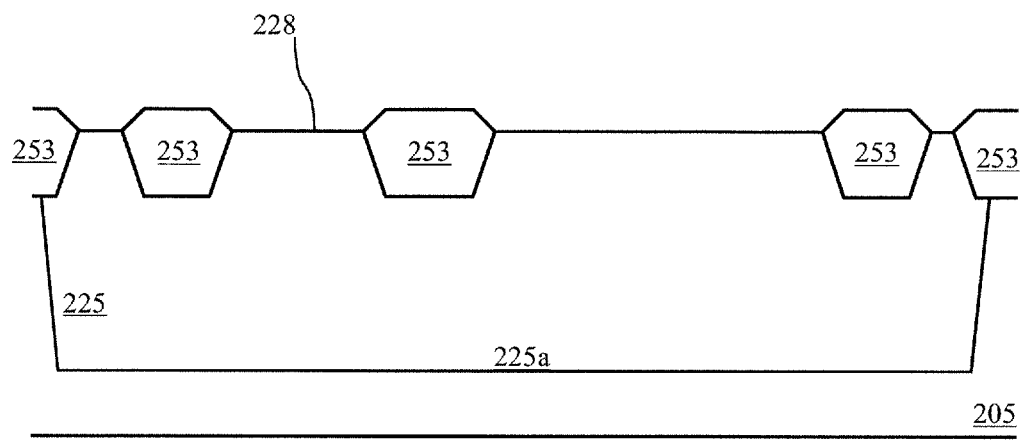
FIGS. 4A-4K illustrate schematically some steps of a manufacturing process of the memory cell according to one embodiment of the present invention.
Figure 4B:
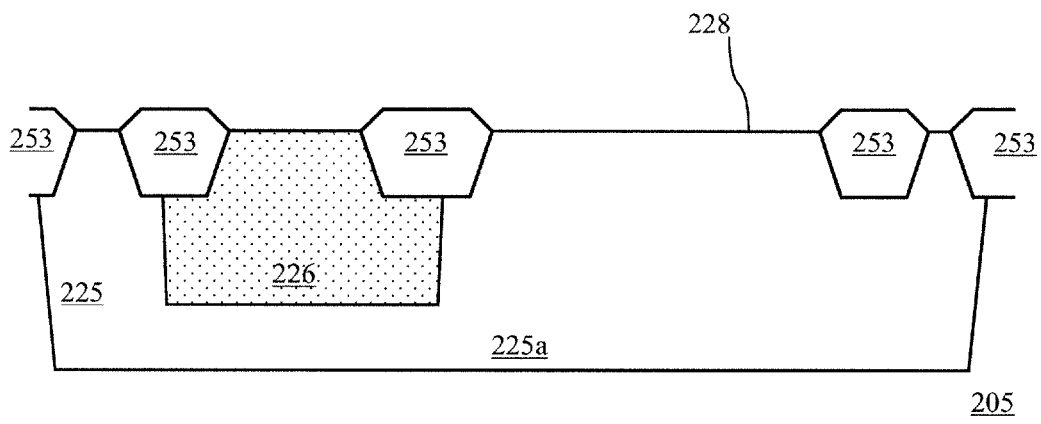
Figure 4C:
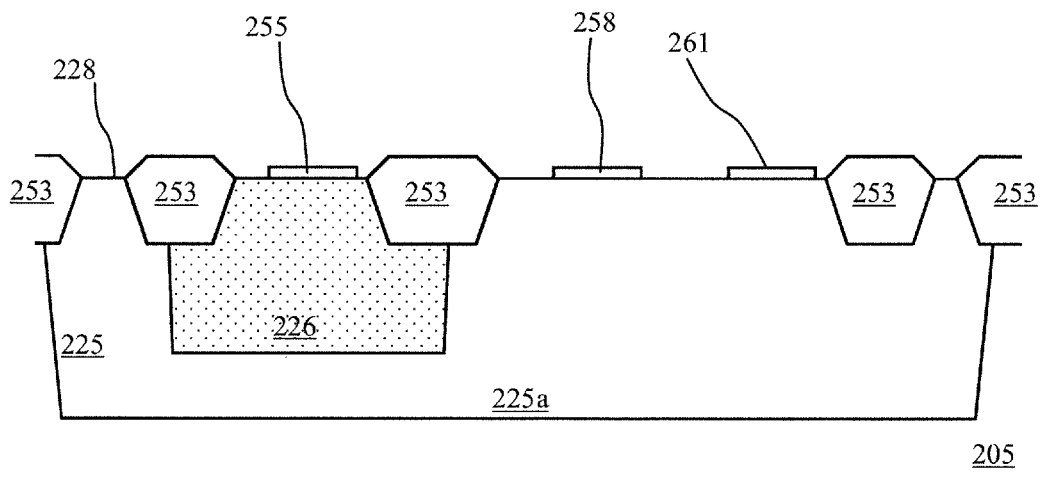

Next (FIG. 4B), the p well 226 is formed inside the n well 225 in the same manner as just described with respect to the formation of the latter. On the surface 228 of the substrate 205 insulating layers 255, 258 and 261 are formed (FIG. 4C). For example, an oxide layer (or more) by CVD and/or by thermal oxidation is initially formed. Selected portions of the oxide layer (e.g., again through photolithography) are then removed (e.g., again through a chemical etching) to define the insulating layers 255, 258 and 261.

Figure 4D:
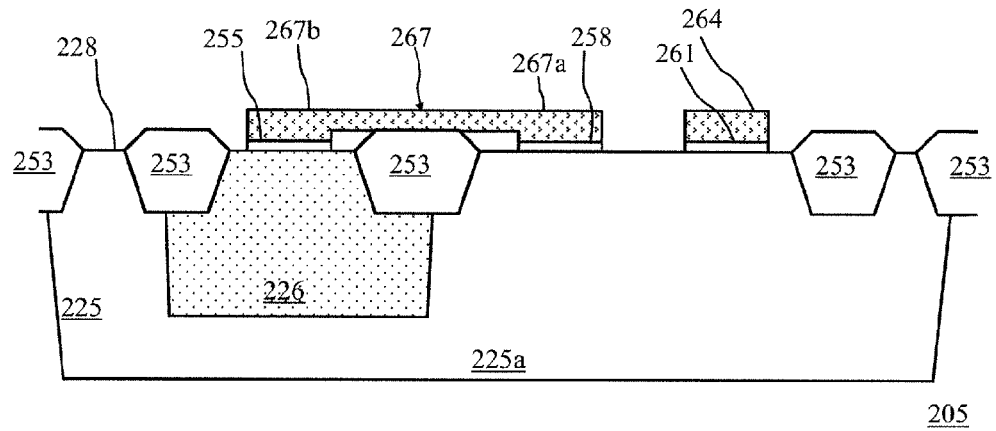

The layer 267 and the floating gate layer 264 are formed above the insulating layers 255 and 258, and the insulating selection layer 261, respectively (FIG. 4D). For example, the floating layer 267 and the gate layer 264 can be formed through a CVD step.

Figure 4E:
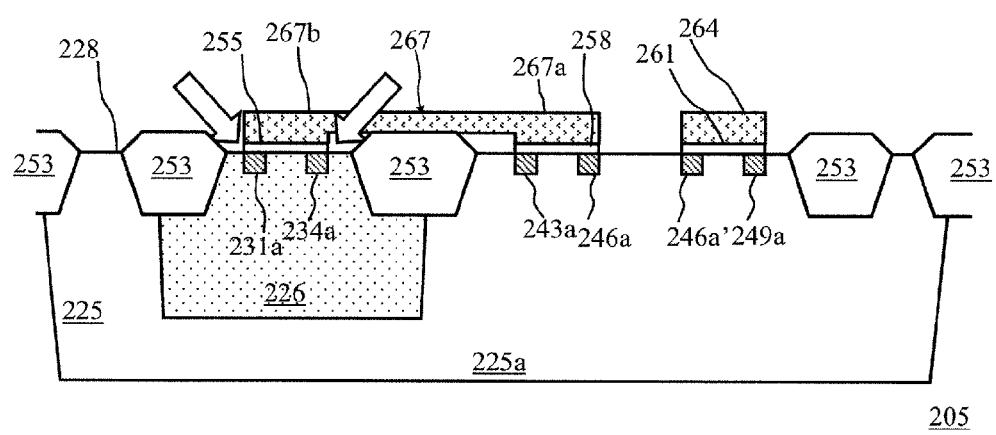

Subsequently, the p* type extension portions 231a, 234a, 243a and 246a of the regions 231, 234, 243 and 246 (and, optionally, the extension portions 246a' and 249a), respectively, are formed (FIG. 4E). For example, the extension portions 231a, 234a, 243a and 246a (and, optionally, the extension portions 246a' and 249a) may be formed via an ion implantation having an angle of incidence transversal to the surface 228 (as indicated by the arrows in FIG. 4E) and exploit the layer 267 and the floating gate layer 264 as self-aligning elements.

Figure 4F:
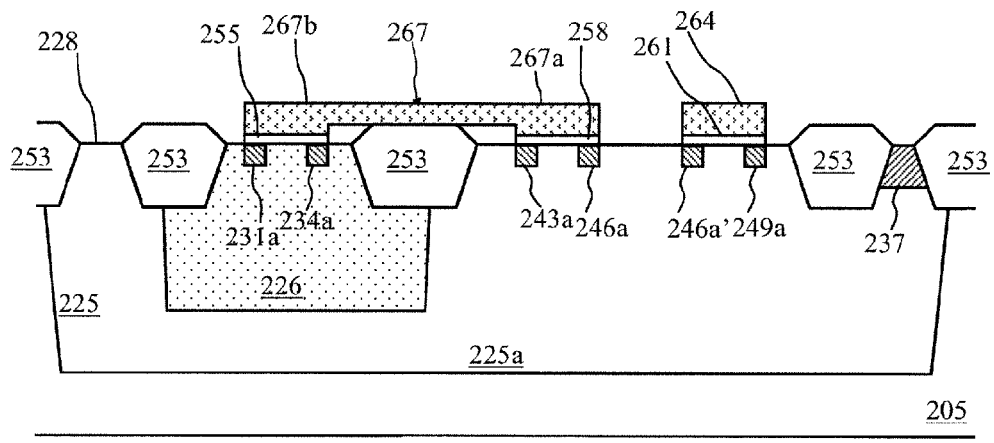
Figure 4G:
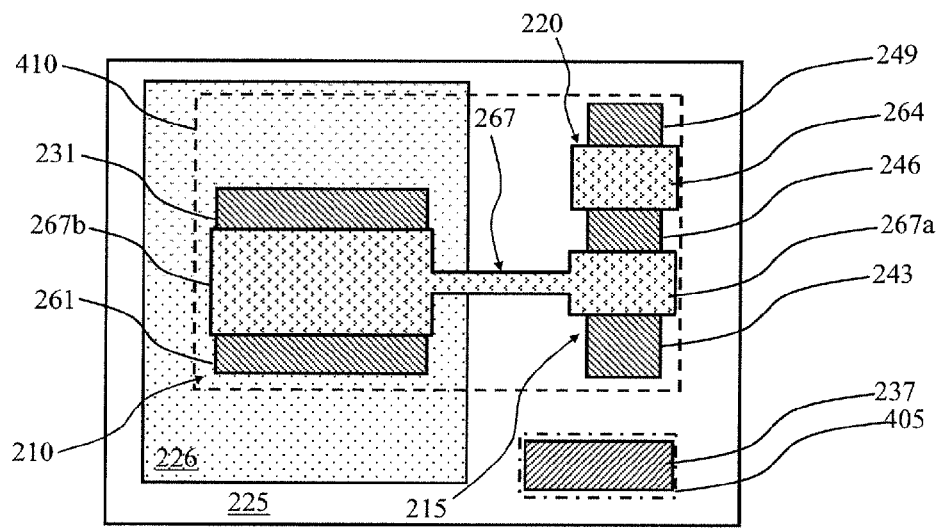

After the extension portions 231a, 234a, 243a and 246a, the n+ well region 237 is formed (FIG. 4F). For example, the region may be formed through an ion implantation process in the n well 225. In one embodiment according to the present invention (FIG. 4G), the n+ contact region 237 may be defined by a dedicated mask 405.

At this point, the floating layer 267, the gate layer 264 and the underlying insulating layers 255 and 258, respectively, are subjected to an oxidation process (e.g., thermal oxidation) to be coated by an insulating spacer layer (not illustrated in the figures for simplicity) formed on side surfaces thereof.

Figure 4H:
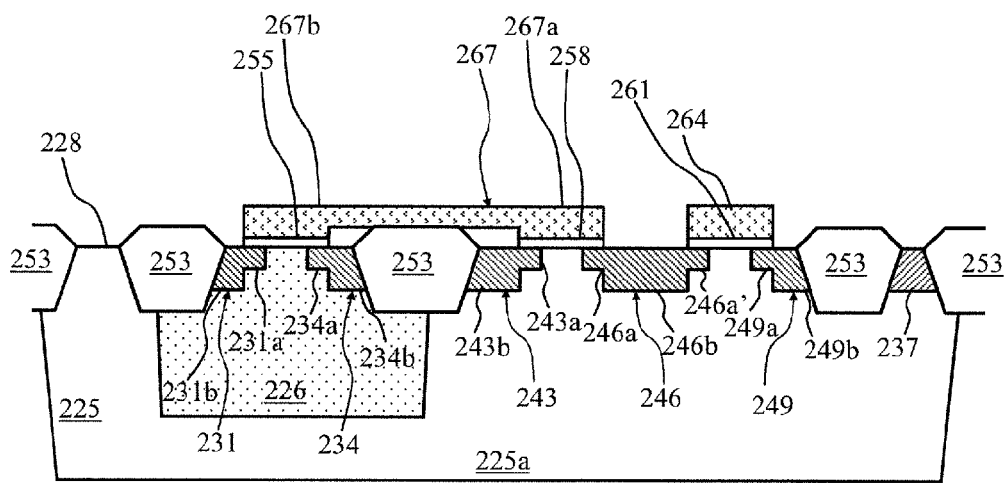

Subsequently, the main portions 231b and 234b of the regions 231 and armature 234, respectively, the main portions 243b and 246b, of the regions 243 and 246, respectively, and the drain region 249 (or its main portion 249b) of the p+ type are formed (FIG. 4H). For example, the main portions 231b, 234b, 243b and 246b and the drain region 249 may be formed by ion implantation through areas of the surface 228 defined by a single mask 415 (shown in FIG. 4F) in a similar manner to what described above.

Advantageously, the floating element 267 acts as a self-aligning element for defining the main portions 231b, 234b, 243b and 246b while the gate layer 264 acts as a self-aligning element for defining the main shared portion 246b and the drain region 249. It should be noted that in this case, the floating layer 267 receives a p+ type doping during this phase of the process. Advantageously, the mask 415 is designed so that the entire floating layer 267 is exposed uniformly the same p+ type doping through ion implantation (in other words, the floating layer 267 has a polysilicon with the same p+ type doping from the transistor portion 267a to the capacitor portion 267b).

Figure 4I:
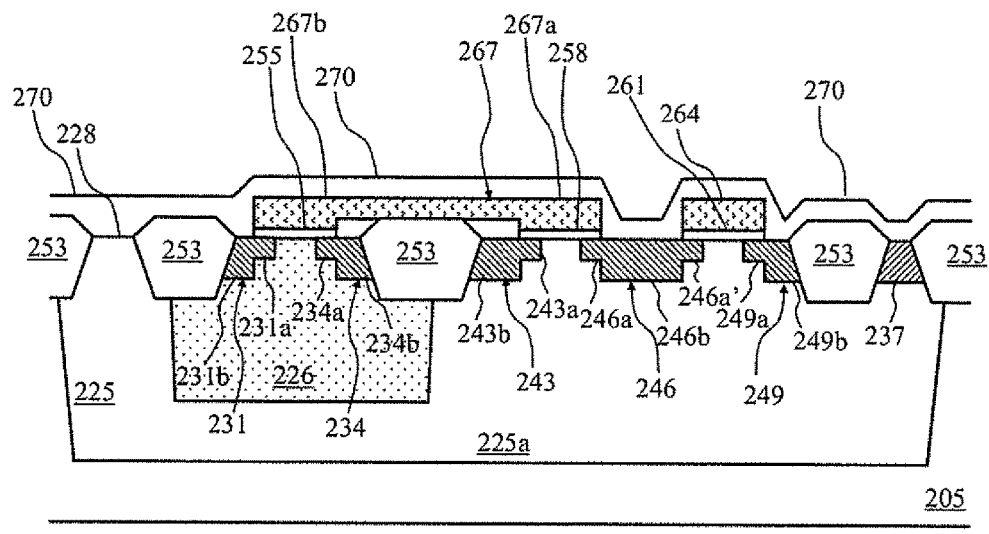

The surface 228 of the substrate 205, the floating layer 267, the gate layer 264 and the insulating layers 255, 258 and 261 are then coated by one or more oxide layers 270 (e.g., a layer of silicon oxide and/or silicon nitride), for example by thermal oxidation and/or CVD (FIG. 4I).

Figure 4J:
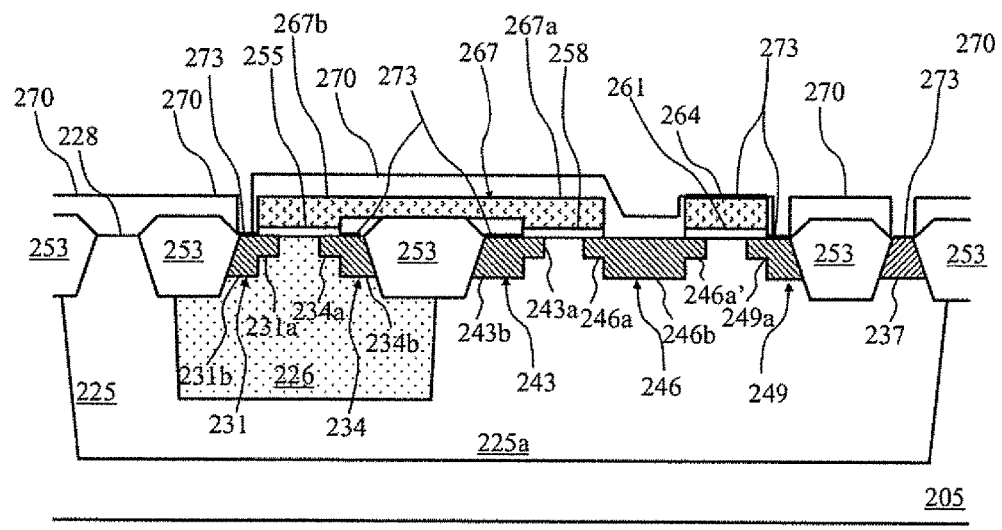

In this way, the floating layer 267 is electrically insulated from what formed in the substrate 205. The oxide layers 270 are selectively removed (e.g., by chemical etching) in correspondence of the regions 237, 231, 234, 243, and 249 and the gate layer 264 (e.g., in areas defined by a photolithographic process), which are then subjected to a silicidation process (FIG. 4J). The silicidation deposits a salicide layer 273 in a transition metal (e.g., cobalt) on the surface 228 in correspondence of the regions 237, 231, 234, 243, 246 and 249 and on the gate layer 264 to facilitate a subsequent connection electric electrical connection with metal elements subsequently formed by means of higher metallization levels to obtain the terminals Tc, Ts, Td, and Tsel previously described.

Figure 4K:
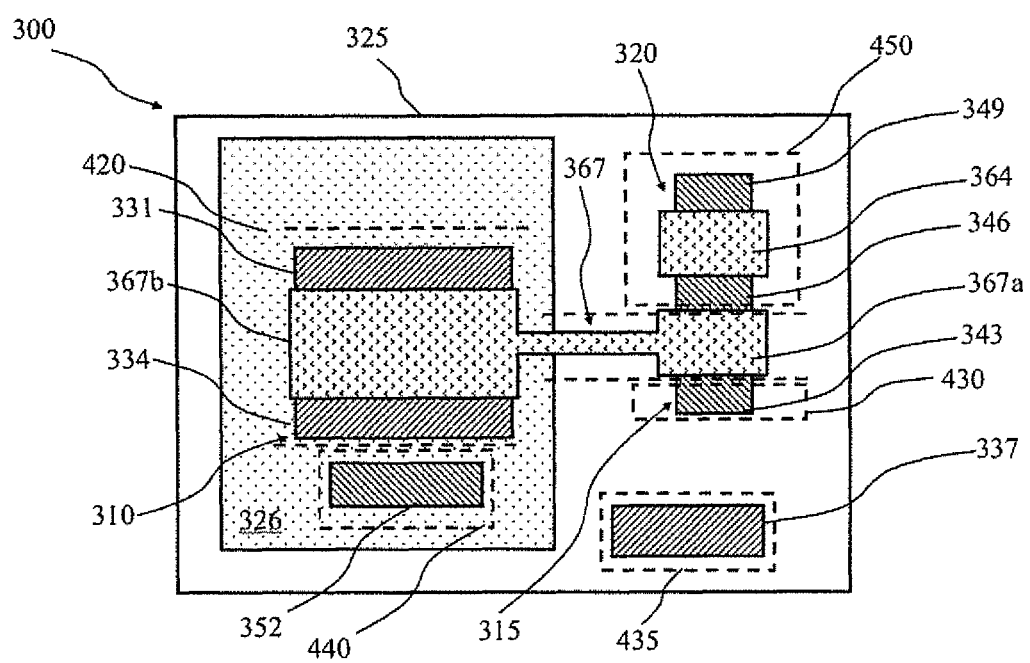

Similar steps are implemented to provide the memory cell 300, mutatis mutandis. In particular, the p+ contact region 352 is formed simultaneously with the main portions 243$b$ and 246$b$. With reference in particular to FIG. 4K, even in the case of the memory cell 300, the floating layer 367 receives a uniform doping during the manufacturing process. Unlike the manufacturing process of the memory cell 200 just described, a corresponding mask 420 is designed so that the entire floating layer 367 and the plate regions 331 and 334 uniformly receive the same n+ type doping ion implantation (in other words, the floating layer 367 has a polysilicon with the same n+ type doping from the transistor portion 367$a$ to the capacitor portion 367$b$) while the regions 343, 337 and 352 are formed by respective masks 430, 435 and 440 while the regions 346, 349 and the gate region 364 are formed through a common mask 450.

Figure 5:
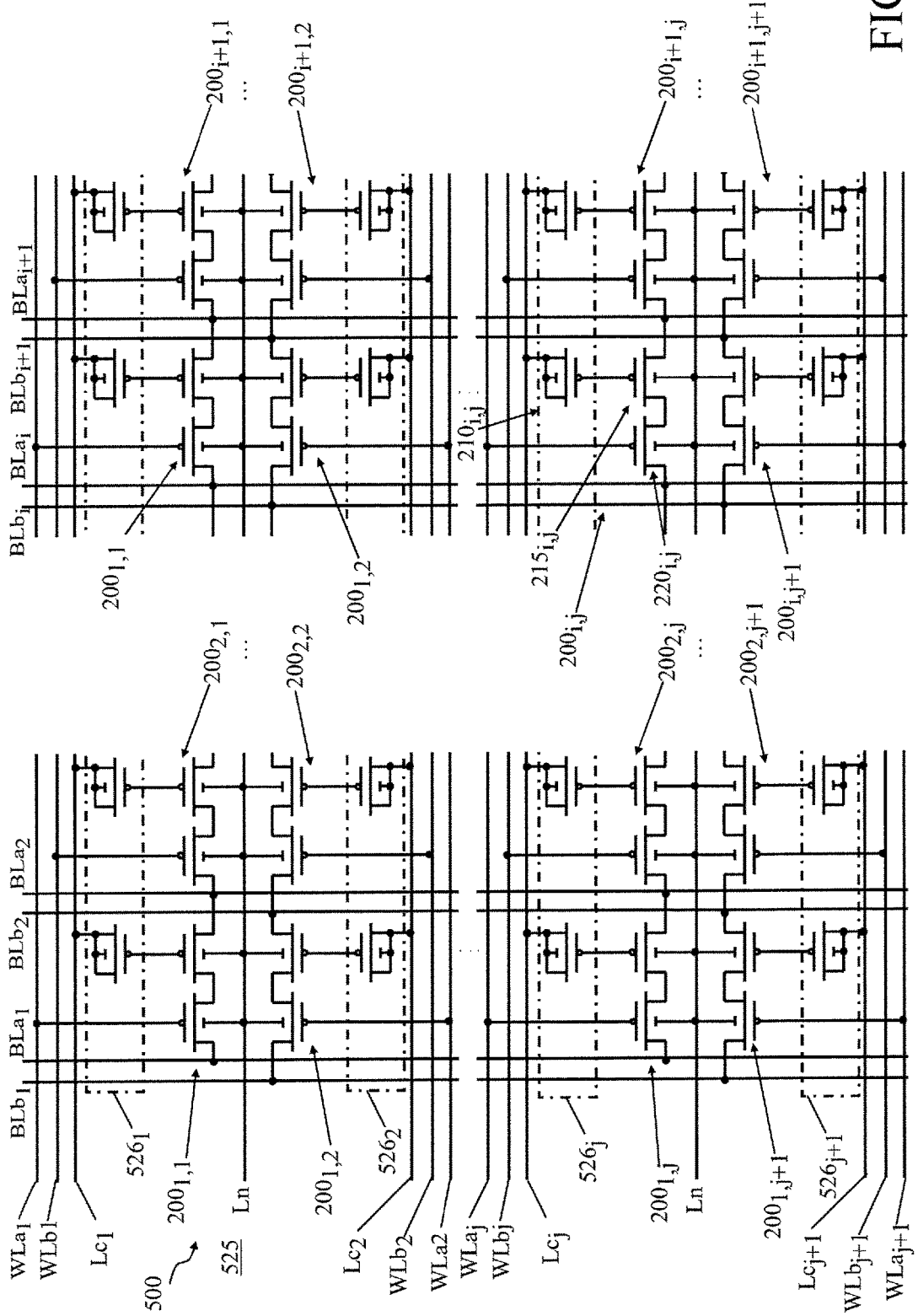
FIG. 5 is a circuit diagram of a portion or sector of the matrix of memory cells according to an embodiment of the present invention.

With reference now to FIG. 5, it is a conceptual circuit diagram of a portion, or sector 500, of a matrix 105 of memory cells 500$_{i,j}$ according to an embodiment of the present invention.

The matrix 105 comprises a plurality of memory cells 200$_{i,j}$ organized in columns i (i=1, . . . , I, I>0) and rows j (j=1, . . . , J, J>0). The plurality of memory cells 200$_{i,j}$ is preferably divided into groups or sectors (of which the sector 500 in FIG. 5 is an example) of memory cells 200$_{i,j}$. The memory cells 200$_{i,j}$ of each sector 500 are formed in a same shared n well 525 (corresponding to the n well 225 illustrated in FIGS. 2A and 2B).

In an alternative embodiment (not shown), all the memory cells 200$_{i,j}$ of the matrix 105 are formed in one same shared n well. In the shared n well 525 is formed a p well 526$_j$ (corresponding to the p well 226 illustrated in FIGS. 2A and 2B) for each row of the matrix 105 comprised in the sector 500.

In the generic shared n well 525, the access portions of the memory cells 200$_{i,j}$ (i.e., the memory transistors 215$_{i,j}$ and the selection transistors 220$_{i,j}$) are formed. In the generic shared p well 526$_j$, the control portions of the memory cells 200$_{i,j}$ (i.e., the capacitor elements 210$_{i,j}$) are formed aligned along the line j. The terminals of the well Tn$_{i,j}$ (connected to the n+ contact regions 237$_{i,j}$) of the memory cells 200$_{i,j}$ in the sector are connected to a same well line Ln (for example connected to the row decoder 115$r$).

In a preferred embodiment, the generic memory transistor 215$_{i,j}$ of the generic memory cell 200$_{i,j}$ shares an intercell region and a respective intercell terminal (not shown in FIG. 5) with the selection transistor 220$_{i+1,j}$ of the generic memory cell 215$_{i+1,j}$ consecutive along the row j. This intercell region corresponds to the shared source region 243$_{i,j}$ of the transistor cell 215$_{i,j}$ and to the drain region of 249$_{i+1,j}$ of the selection transistor 220$_{i+1,j}$. The intercell terminal corresponds to the source terminal Ts$_{i,j}$ of the transistor cell 215$_{i,j}$ and to the drain terminal Td$_{i+1,j}$ of the selection transistor 220$_{i+1,j}$. Such intercell terminal shared by memory cells 200$_{i,1}$, 200$_{i+1,j}$ aligned on row j is connected to a bit line BLa$_i$ or BLb$_i$ according to whether the second memory cell 200$_{i,j}$ is aligned on an odd or equal column of the matrix 105 (with the bit line BLa$_i$ or BLb$_i$ connected, for example, the column decoder 115$c$).

The selection terminal Tsel$_{i,j}$ of each memory cell 200$_{i,j}$ is connected to a respective word line WLa$_j$ or WLb$_j$ (e.g., connected to the row decoder 115$r$). Preferably, each memory cell 200$_{i,j}$ aligned on the same column i is connected to a word line WLa$_j$ or WLb$_j$ according to whether the second memory cell is aligned on an odd or even line j, respectively (with each memory cell 200$_{i,j}$ in odd positions in the column connected to the same word line WLa$_j$ and each memory cell 200$_{i,j}$ in even position in the column connected to the same word line WLb$_j$). In this way, it is possible to independently perform the read/write operations of each memory cell 200$_{i,j}$ whose access portions (i.e., the transistors 215$_{i,j}$ e 220$i$) are formed in the n well 525.

The capacitor terminal Tc$_{i,j}$ (connected to the regions of armor 231$_{i,j}$ and 234$_{i,j}$) of each memory cell 200$_{i,j}$ aligned on a same row j is connected to a control line Lc$_j$ (e.g., connected to the row decoder 115$r$) In Table 2 below, are presented biasing schemes similarly to what indicated in Table 1 but applied to the signal lines Ln, Lc$_j$, BLa/b$_i$ and WLa/b$_j$ (connected to terminals Tn$_{i,j}$, Tc$_{i,j}$, Ts$_{i,j}$, Td$_{i,j}$ e Tsel$_{i,j}$ of the memory cells 200$_{i,j}$).

TABLE 2

|  | Lc$_j$ | WLa/b$_j$ | Ln | BLa$_i$ | BLb$_i$ |
|---|---|---|---|---|---|
| Erase | GND | GND | GND | Ve | Ve |
| Program | Vp | GND | GND | GND | GND |
| Read | Vr | GND | Vdd | Vsr | Vdr |
| Program inhibition | Vp | GND | GND | Vi | GND |

Because of the structure of the matrix 105 described above, it is possible to select a granularity of the program operation. In one embodiment, it is possible to perform the erase operation jointly on all memory cells 200$_{i,j}$ in the sector 500 (as in the case of FLASH type NVM), on a word (i.e., all of memory cells 200$_{i,j}$ aligned on a same column i of the matrix 105) of the sector 500, or separately on a single memory cell 200$_{i,j}$ (as in the case of EEPROM type NVM).

In greater detail, to obtain the erase of the entire sector 500 it is sufficient to apply the biasing scheme for the erase operation to all memory cells 200$_{i,j}$ in the sector 500 (via the signal lines Ln, Lc$_j$, WLa/b$_j$ and BLa$_i$/b$_i$) Otherwise, to obtain the erase of a single word (i.e. of the memory cells 200$_{i,j}$ aligned along a same column i) it is sufficient to apply the biasing scheme for the erase operation only to memory cells 200$_{i,j}$ aligned along the same column i (via the signal lines Ln, Lc$_j$, WLa/b$_j$ and BLa/b$_i$).

The program operation has a selectable granularity in the matrix 105 according to one embodiment. Advantageously, by applying the program biasing scheme on a single word of the sector 500 and applying the program inhibition biasing scheme to the remaining memory cells of the matrix 105 it is possible to execute the program in a limited fashion. Alternatively, it is possible to execute the program on the sector 500 by applying the biasing program scheme to all the words of sector 500. The reading of the logic values stored in each memory cell 200$_{i,j}$ in the sector 500 may be performed cell by cell by applying the read biasing scheme to signal lines Ln, Lc$_j$, WLa/b$_j$ and BLa/b$_i$ connected to a selected memory cell 200$_{i,j}$.

The emNVM 100 according to one embodiment may be configured for storing data in differential mode. This mode allows obtaining a greater reliability of the correctness of the data stored than the normal storage mode.

According to the differential mode, each datum is stored configuring complementary logic values in a pair of memory cells (e.g., the memory cells 200$_{1,1}$ and 200$_{i,j}$). The data associated with each pair of memory cells 200$_{1,1}$ and 200$_{i,j}$ is determined by comparing the currents generated by the memory cells 200$_{1,1}$ and 200$_{i,j}$ of the pair during the read operation.

The emNVM 100 may effectively implement the differential storage mode thanks to the distance between the erase value Vth$_{erase}$ and the program value Vth$_{prog}$ mentioned above, which allows obtaining currents generated by the memory cells $200_{1,1}$ and $200_{i,j}$ of the pair having substantially different intensities. In this way, the comparison between the currents generated by the memory cells $200_{1,1}$ and $200_{i,j}$ of a pair is less prone to errors, thereby improving the reading efficiency of the emNVM 100 (at the same time, relaxing the design constraints to which a current comparison element, such as a sense amplifier, is subject).

Advantageously, the structure of the memory cell $200_{i,j}$ allows using voltages Ve, Vr, Vdr, Vsr and Vi of value lower than or equal to the value of the supply voltage Vdd, thus obtainable without the need to exploit voltage multipliers devices such as charge pumps. In this way, only the capacitor line $Lc_j$ has to be sized in such a way to operate with a program voltage Vp of value greater than the value of the supply voltage Vdd. In other words, only the line $Lc_j$ (of each row of the matrix 105) has to be subject to more stringent design constraints, in order to operate properly to the value of the program voltage Vp. This also enables a general reduction of the complexity of the circuitry comprised in the row decoder 115r, in the column decoder 115c and the read/write unit 120 (only each line $Lc_j$ has to be connected to an element able to bias them to high voltages such as a High Voltage Driver) thereby allowing a further area saving.

Because of the arrangement of the memory cells $200_{i,j}$ within the sector 500, the control matrix 105 is simple and versatile. It should be noted that it is possible to produce an alternative matrix 105 (not shown) comprising a plurality of memory cells 300 in the same way as just described in relation to FIG. 5, mutatis mutandis. Also in this case, it is possible to obtain the same advantages described above.

Figure 6:
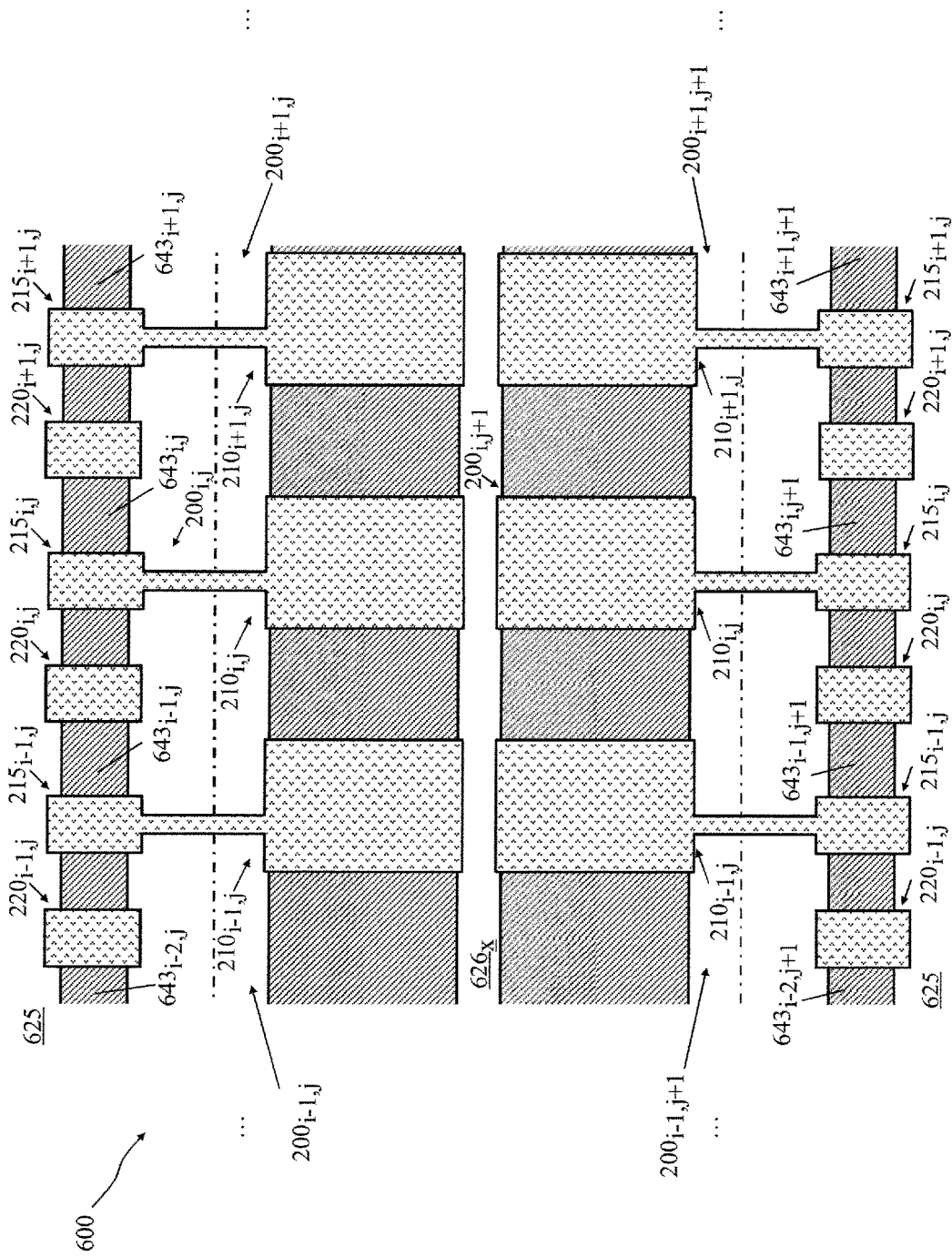
FIG. 6 is a schematic plan view of a portion of a sector of the matrix of memory cells according to an alternative embodiment of the present invention.

Turning now to FIG. 6, a schematic plan view of a portion of a sector 600 of the matrix of memory cells $200_{i,j}$ according to an alternative embodiment is illustrated. The sector 600 differs from the sector 500 just described in what follows. Within a shared well 625 in which the access portions are formed (i.e., the memory $215_{i,j}$ and $215_{i,j+1}$, and selection $220_{i,j}$ and $220_{i,j+1}$ transistors) is formed a shared p well $626_x$ (x=0, . . . , X, X=J/2) in which the control portions (i.e., the capacitive elements $210_{i,j}$ and $210_{i,j+1}$) of the generic memory cells $200_{i,j}$ and $200_{i,j+1}$ aligned along pairs of rows j and j+1 row consecutive in the matrix 105 are formed.

Preferably, also in the case of the sector 600, the generic memory transistor $215_{i,j}$ of the generic memory cell $200_{i,j}$ shares an intercell region $643_i$ and a respective intercell terminal (not shown in FIG. 6) with the selection transistor $220_{i+1,j}$ of the generic memory cell $215_{i+1,j}$ consecutive in the row j. This intercell region corresponds to the shared source region $243_{i,j}$ of the transistor cell $215_{i,j}$ and to the drain region $249_{i+1,j}$ of the selection transistor $220_{i+1,j}$. The intercell terminal corresponds to the source terminal $Ts_{i,j}$ of the transistor cell $215_{i,j}$ and to the drain terminal $Td_{i+1,j}$ of the selection transistor $220_{i+1,j}$. Such intercell terminal shared by memory cells $200_{i,j}$, $200_{i+1,j}$ aligned on row j is connected to a bit line $BLa_i$ or $BLb_i$ or that the second memory cell $200_{i,j}$ is aligned on a column the odd or equal to the matrix 105 (with the bit line $Bla_i$ or $BLb_i$ connected, for example, the column decoder 115c).

The selection terminal $Tsel_{i,j}$ of each memory cell $200_{i,j}$ is connected to a respective word line or word line $WLa_j$ or $WLb_j$ (e.g., connected to the row decoder 115r). Preferably, each memory cell $200_{i,j}$ aligned on the same column is connected to a word line $WLa_j$ or $WLbj$ according to whether the second memory cell is aligned on an odd or even row j, respectively (with each memory cell $200_{i,j}$ in the odd positions in the column connected to the same word line $WLa_j$ and each memory cell $200_{i,j}$ in even position in the column connected to the same word line $WLb_j$). In this way, it is possible to independently perform the read/write operations of each memory cell $200_{i,j}$ whose access portions (i.e., the transistors $215_{i,j}e$ $220i$) are formed in the n well 625.

In the sector 600, the capacitor terminals $Tc_{i,j}$ and $Tc_{i,j+1}$ (related to the plate regions $231_{i,j}$ and $234_{i,j}$, and $231_{i,j+1}$ and $234_{i,j+1}$) of each of the memory cells $200_{i,j}$ $200_{i,j+1}$ aligned on adjacent rows j and j+1 formed in the same shared p well $626_x$ are connected to a shared control line $Lc_x$ (e.g., connected to the row decoder 115r).

The memory cells $200_{i,j}$ in the sector 600 are subjected to erase, program, read and program inhibition operations through the same biasing schemes presented in Table 2 for the sector 500 (by replacing the control lines $Lc_j$ with the shared control lines $Lc_x$). The sector 600 allows obtaining a structure of the matrix 105 even more compact compared to the sector 500 previously described, while maintaining the same advantages of the latter.

It should be noted that it is possible to provide an alternative matrix 105 (not shown) comprising a plurality of memory cells 300 in the same way as just described in relation to FIG. 6, mutatis mutandis. Also in this case it is possible to obtain the same advantages described above.

Naturally, the structures of non-volatile memory described above in relation to an embedded non-volatile memory can be implemented in a not embedded non-volatile memory without requiring substantial modifications.

The invention claimed is:

1. A non-volatile memory, comprising:
a first memory cell including:
a first access portion in a first well of semiconductor material having a doping of a first type, the first access portion including a first transistor that includes a first source region abutting the first well;
a first control portion in a second well of semiconductor material having a doping of a second type, the second well being in the first well, the first control portion including a capacitive element that includes:
a first spaced apart region having a doping of the second type, the first spaced apart region including a first base portion and a first extension portion extending away from the first base portion in a first direction, the first extension portion having a dopant concentration that is different than a dopant concentration of the first base portion; and
a second spaced apart region having a doping of the second type, the second spaced apart region including a second base portion and a second extension portion extending away from the second base portion toward the first extension portion, the second extension portion having a dopant concentration that is different than a dopant concentration of the second base portion; and
an electrically floating layer including a conductive material, the electrically floating layer coupling the first access portion and the first control portion, the electrically floating layer coupling the first access portion and the first control portion, the electrically floating layer coupled to the first control portion with a first capacitance and the first access portion with a second capacitance, the first capacitance being greater than the second capacitance, a ratio of the first capacitance to a sum of the first capacitance and the second capacitance being greater than or equal to 0.8; and
a second memory cell adjacent to the first memory cell, the second memory cell including:

a second access portion in the first well; and
a second control portion in the second well.

2. The non-volatile memory according to claim 1, wherein the first access portion includes:
the first transistor including the first source region, a shared region, and a first gate region, the shared gate region is a first drain region of the first transistor; and
a second transistor including the shared region, a second drain region, and a second gate region, the shared region is a second source region of the second transistor.

3. The non-volatile memory according to claim 2, further comprising a first contact region of semiconductor material having a doping of the first type in the first well.

4. The non-volatile memory according to claim 2, wherein the first gate region includes a portion of the electrically floating layer, and the capacitive element includes a second portion of the electrically floating layer.

5. The non-volatile memory according to claim 2, further including:
a row connecting line connected to the second drain region and a word line connected to a conductive material of the second gate region, and
a control connecting line couple to the first and second spaced apart regions.

6. The non-volatile memory according to claim 2, wherein the first transistor includes a first insulating layer of electrically insulating material between the first gate region and the first source and shared regions; and
wherein the second transistor includes a second insulating layer of electrically insulating material between the second gate region and the second drain and shared regions.

7. The non-volatile memory according to claim 1, wherein the first control portion is configured to be traversed by an electric current configured to extract charge carriers from the electrically floating layer through Fowler-Nordheim tunneling to store a first logic in the first memory cell, and the first access portion is further configured to be traversed by an electric current configured to inject charge carriers in the electrically floating layer by injection of band-to-band tunneling-induced hot electronics to store a second logic value.

8. The non-volatile memory comprising:
a plurality of memory cells arranged in a plurality of rows and columns, the plurality of memory cells being divided into a first sector and a second sector, each including at least a portion of the plurality of memory cells, each memory cell including:
an access portion in a first well of semiconductor material implanted with dopants of a first type, the access portion including a first transistor that includes a first drain region that is in direct contact with the first well;
a control portion in a second well of semiconductor material implanted with dopants of a second type, the control portion including a capacitive element that includes:
a first spaced apart region having a doping of the second type, the first spaced apart region including a first base portion and a first extension portion extending away from the first base portion in a first direction, the first extension portion having a dopant concentration that is different than a dopant concentration of the first base portion; and
a second spaced apart region having a doping of the second type, the second spaced apart region including a second base portion and a second extension portion extending away from the second base portion toward the first extension portion, the second extension portion having a dopant concentration that is different than a dopant concentration of the second base portion, the second well extending between the first and the second extension portions; and
an electrically floating layer including conductive material, the electrically floating layer coupling the access portion and the control portion of an individual memory cell of the plurality of memory cells, the electrically floating layer having a first capacitive coupling with the control portion and a second capacitive coupling with the access portion, the first capacitive coupling having a first capacitance that is greater than a second capacitance of the second capacitive coupling, a ratio of the first capacitance to a sum of the first capacitance and the second capacitance being greater than or equal to 0.8, respective control portions of the memory cells of the first sector being in the first well.

9. The non-volatile memory according to claim 8, wherein the access portion includes:
the first transistor including a first source region, a shared region, and a first gate region, the shared region is the first drain region of the first transistor; and
a second transistor including a second drain region, the shared region, and a second gate region, the share region is a second source region of the second transistor.

10. The non-volatile memory according to claim 9, wherein the first gate region includes a portion of the electrically floating layer, and the capacitive element includes a second portion of the electrically floating layer.

11. The non-volatile memory according to claim 8, wherein the respective controls portions of the memory cells of the first sector are in respective second wells, each respective second well being in the first well.

12. The non-volatile memory according to claim 8, wherein the plurality of memory cells aligned on a same row share a shared region corresponding to a source region of a first transistor of a given memory cell and to a drain region of a second transistor of a further memory cell in a next position in the same row of memory cells.

13. A device, comprising:
a first cell including:
a first access portion in a first well of semiconductor material having a doping of first type, the first access portion including a first transistor that includes a first source region in abutting contact with the semiconductor material having the doping of the first type;
a first control portion in a second well of semiconductor material having a doping of second type, the first type being different than the second type, the second well being in the first well, the first control portion including a capacitive element that includes:
a first spaced apart region having doping of the second type in contact with the semiconductor material of the second well, the first spaced apart region including a first base portion and a first extension portion extending toward a second extension portion, the first extension portion having a dopant concentration that is different than a dopant concentration of the first base portion; and
a second spaced apart region having doping of the second type in contact with the semiconductor material of the second well, the second spaced apart region including a second base portion and the second extension portion extending toward the first extension portion, the second extension portion having a dopant concentration that is different than a dopant concentration of the second base portion, the first and second spaced apart regions being aligned on a first axis; and an electrically floating layer including a conductive material, the electrically floating layer coupling the first access portion and the first control portion, the electrically floating layer coupled to the first control portion with a first capacitance and the first access portion with a second capacitance, the first capacitance being greater than the second capacitance, a ratio of the first capacitance to a sum of the first capacitance and the second capacitance being greater than or equal to 0.8, the electrically floating layer being aligned along a second axis that is transverse to the first axis; and a second cell including:
a second access portion in the first well; and
a second control portion in the second well.

14. The device according to claim 13, wherein the first access portion includes:

the first transistor including the first source region, a shared region, and a first gate region, the shared region is a first drain region of the first transistor; and a second transistor including the shared region, a second drain region, and a second gate region, the shared region is a second source region of the second transistor, the first and second transistors being aligned on the first axis.

15. The device according to claim 14, wherein the first gate region includes a portion of the electrically floating layer, and the capacitive element includes a second portion of the electrically floating layer.

16. The device according to claim 14, further including a row connecting line connected to the second drain region and a word line connected to a conductive material of the second gate region.

17. The device according to claim 13, further including a control connecting line coupled to the first and second spaced apart regions.

18. A device, comprising:
a substrate;
a first well of a first doped semiconductor material in the substrate;
a plurality of second wells of a second doped semiconductor material in the first well, the second doped semiconductor material being of a different conductivity type than the first doped semiconductor material;
a plurality of memory cells in the substrate, each memory cell of the plurality of memory cells including:
an access portion in contact with the first doped semiconductor material, the access portion including a first transistor including a first drain region that abuts the first doped semiconductor material; and
a control portion in a respective second well of the plurality of second wells, the control portion including a capacitive element that includes:
a first plate having a first lower portion and a first extension portion;
a second plate having a second lower portion and a second extension portion, the first and second plates being spaced apart from each other, a portion of the respective second well being between the first and second plates, the first and second plates abutting the second doped semiconductor material, the first and second extension portions extending towards each other from the respective first and second lower portions; and
an electrically floating layer including a conductive material, the electrically floating layer being coupled to the access portion and the control portion of a first memory cell of the plurality of memory cells, the electrically floating layer being coupled to the access portion with a first capacitance and coupled to the control portion with a second capacitance that is less than the first capacitance, a ratio of the first capacitance to a sum of the first capacitance and the second capacitance being greater than or equal to 0.8.

19. The device of claim 18, wherein each memory cell includes an isolation region in the substrate that extends partially into the respective second well and abuts the second plate.

* * * * *

UNITED STATES PATENT AND TRADEMARK OFFICE
CERTIFICATE OF CORRECTION

PATENT NO. : 10,468,425 B2
APPLICATION NO. : 14/605303
DATED : November 5, 2019
INVENTOR(S) : Luca Milani et al.

It is certified that error appears in the above-identified patent and that said Letters Patent is hereby corrected as shown below:

In the Claims

Column 14, Lines 56-59:
"the electrically floating layer coupling the first access portion and the first control portion, the electrically floating layer coupling the first access portion and the first control portion"
Should read:
--the electrically floating layer coupling the first access portion and the first control portion--.

Column 15, Lines 6 and 7:
"the shared gate region"
Should read:
--the shared region--.

Column 15, Line 24:
"a control connecting line couple to the first and second"
Should read:
--a control connecting line coupled to the first and second--.

Column 15, Line 38:
"tunneling to store a first logic in the first memory cell"
Should read:
--tunneling to store a first logic value in the first memory cell--.

Column 15, Line 42:
"hot electronics to store a second logic value"
Should read:
--hot electrons to store a second logic value--.

Signed and Sealed this
Fourth Day of February, 2020

Andrei Iancu
*Director of the United States Patent and Trademark Office*

CERTIFICATE OF CORRECTION (continued)
U.S. Pat. No. 10,468,425 B2

Column 15, Line 43:
"The non-volatile memory comprising:"
Should read:
--A non-volatile memory comprising:--.

Column 16, Line 4:
"the share region"
Should read:
--the shared region--.

Column 16, Line 33:
"wherein the respective controls portions of the memory cells"
Should read:
--wherein the respective control portions of the memory cells--.